(12) United States Patent
Kinoshita et al.

(10) Patent No.: US 6,649,270 B2
(45) Date of Patent: Nov. 18, 2003

(54) SIC JIG FOR USE IN HEAT TREATMENT

(75) Inventors: Toshiharu Kinoshita, Kakamigahara (JP); Shigeru Ogura, Kani-gun (JP)

(73) Assignees: NGK Insulators, Ltd. (JP); NGK Adrec Co., Ltd. (JP)

( * ) Notice: Subject to any disclaimer, the term of this patent is extended or adjusted under 35 U.S.C. 154(b) by 0 days.

(21) Appl. No.: 09/984,366

(22) Filed: Oct. 30, 2001

(65) Prior Publication Data

US 2002/0076560 A1 Jun. 20, 2002

(30) Foreign Application Priority Data

Oct. 31, 2000 (JP) .................................... 2000-332574

(51) Int. Cl.[7] ................................................ B32B 9/04
(52) U.S. Cl. ................... 428/446; 428/408; 428/698
(58) Field of Search ................. 428/408, 446, 428/698; 432/156, 262, 265

(56) References Cited

U.S. PATENT DOCUMENTS 6,210,786 B1 * 4/2001 Atmur et al. ............ 428/293.4
6,355,206 B1 * 3/2002 Hanzawa et al. ............ 266/239
6,399,187 B1 * 6/2002 Terasaki et al. ......... 428/307.7
6,447,894 B1 * 9/2002 Hirotsuru et al. ........ 428/307.7

FOREIGN PATENT DOCUMENTS

| JP | 06-001660 | 1/1994 |
| JP | 06-092735 | 4/1994 |

* cited by examiner

Primary Examiner—Deborah Jones
Assistant Examiner—Abraham Bahta
(74) Attorney, Agent, or Firm—Parkhurst & Wendel, L.L.P.

(57) ABSTRACT

There is provided a jig for use in heat treatment onto which a vitreous plate having had films exhibiting respective given functions formed on its surface is to be loaded when the vitreous plate undergoes heat treatment. The jig contains 50% by weight or more phase containing SiC, its thermal conductivity is 10 W/mK or more, its apparent porosity 0.2 to 25%, and in that its coefficient of thermal expansion is $3.8 \times 10^{-6}/°C.$ to $5.5 \times 10^{-6}/°C.$

9 Claims, No Drawings

SIC JIG FOR USE IN HEAT TREATMENT

BACKGROUND OF THE INVENTION AND RELATED ART STATEMENT

The present invention relates to a jig for use in heat treatment onto which a vitreous plate having had films exhibiting respective given functions, such as a glass substrate for a plasma display panel, formed on its surface is to be loaded when the vitreous plate undergoes heat treatment.

In recent years, large screen flat panel displays (hereinafter referred to as "FPDs") which can be used as displays for wall-mounted televisions and multimedia are being put into practical use steadily. And a plasma display panel (hereinafter referred to as "PDP"), which has not only qualitative merit of good-quality displaying due to its self-emitting characteristic and its wide viewing angle, but also production merit of simple production process and allowing a large size display with ease, is considered to be one of the promising large size FPDs.

PDP is produced by first forming films, which exhibit respective given functions such as electrode, dielectric and fluorescent material, one by one on the respective surfaces of large size glass substrates referred to as front and rear glass substrates by the thick film method, in which the process steps of printing, drying and firing are repeated more than one time, and finally bonding and sealing the front and rear glass substrates together.

Vitreous plates, such as glass substrates for PDP, on the surface of which films exhibiting respective given functions are formed are subjected to heat treatment at 500 to 900° C. so as to, for example, form films, eliminate the distortion of glass substrates and bond and seal the glass substrates, and the heat treatment process requires a jig for use in heat treatment, referred to as setter, which carries the vitreous plates loaded thereon through a heat treating furnace. Generally jigs for use in heat treatment have been those made of an alumina material or a crystallized glass material.

However, jigs for use in heat treatment which are made of an alumina material have problems of causing warps in themselves and losing their flatness with time due to heating/cooling operations repeated during the heat treatment since their coefficient of thermal expansion is as large as about $8\times10^{-6}/°C.$, which in turn causes warps in the vitreous plates, as the object of heat treatment, and causes defects in the films having been formed on the vitreous plates. These problems have been becoming serious with the increase in size of the vitreous plates. In the aforementioned PDPs, for example, those as large as about 42 to 60 inches are commercially produced to make a clear distinction between the PDPs and the conventional display media such as cathode ray tubes; as a result, defects are more likely to occur due to the warps caused in the jigs themselves.

For jigs for use in heat treatment which are made of a crystallized glass material, their coefficient of thermal expansion is as small as about $-0.4\times10^{-6}/°C.$, and they are less likely to warp themselves. They, however, have problems such that since vitreous plates used for FPD, such as the aforementioned glass substrates for PDP, have coefficients of thermal expansion as large as about $8\times10^{-6}/°C.$, the difference in thermal expansion between the jig and the vitreous plates causes friction during the heat treatment, and the shape of the vitreous plates is changed into a trapezoid in the direction of advance thereof in a heat treating furnace if soaking is not carried out sufficiently. Further, for jigs for use in heat treatment which are made of a crystallized glass material, since their thermal conductivity is as small as about 1 W/mK, subjecting the vitreous plates loaded onto such jigs to a uniform heat treatment requires a plenty of heating and cooling durations, which makes the heat treatment inefficient.

Further, for jigs for use in heat treatment which are made of a crystallized glass material, since their apparent porosity is very close to zero, when vitreous plates for FPDs, such as the aforementioned glass substrates for a PDP, are loaded onto them, it takes a longer time to position the vitreous plates sliding on the jigs. And when unloading the vitreous plates from the crystallized glass jigs for use in heat treatment, the unloading operation cannot be carried out smoothly due to the jigs' adsorbing action. In order to overcome this problem, it is necessary, for example, to provide such jigs with new fine pores through which the air is allowed to flow in. This problem also has become more serious with the increase in size of the vitreous plates.

SUMMARY OF THE INVENTION

This invention has been made in light of the aforementioned problems which the prior art has. Accordingly, the object of this invention is to provide a jig for use in heat treatment which has a coefficient of thermal expansion appropriate to inhibiting occurrence of warps in the jig itself with time and occurrence of deformations in vitreous plates due to the friction caused when heat treating large sized vitreous plates as large as about 42 to 60 inches, has such an excellent thermal conductivity that heat treatment of vitreous plates can be performed uniformly and effectively in a relatively short period of time, and exhibits improved handleability in loading and unloading the vitreous plates.

This invention provides a SiC jig for use in heat treatment onto which a vitreous plate having had films exhibiting respective given functions formed on its surface is to be loaded when the vitreous plate undergoes heat treatment, the SiC jig being characterized in that it contains 50% by weight or more phase containing SiC, its thermal conductivity is 10 W/mK or more, its apparent porosity 0.2 to 25%, and its coefficient of thermal expansion $3.8\times10^{-6}/°C.$ to $5.5\times10^{-6}/°C.$ (a first jig for use in heat treatment).

Further, this invention provides a SiC jig for use in heat treatment onto which a vitreous plate having had films exhibiting respective given functions formed on its surface is to be loaded when the vitreous plate undergoes heat treatment, the SiC jig being characterized in that it contains 50% by weight or more SiC particles of particle diameter 3.5 mm or less, its thermal conductivity is 10 W/mK or more, its apparent porosity 0.2 to 25%, and its coefficient of thermal expansion $3.8\times10^{-6}/°C.$ to $5.5\times10^{-6}/°C.$ (a second jig for use in heat treatment).

DETAILED DESCRIPTION OF PREFERRED EMBODIMENTS

In either of the first and second jigs for use in heat treatment according to this invention, warps can be inhibited which are caused with time in the jig itself due to the heating/cooling operations repeated during the heat treatment, since its coefficient of thermal expansion is controlled to be $5.5\times10^{-6}/°C.$ or less. Further the difference in thermal expansion between the jig and the vitreous plate, which is to be used for FPD, becomes small compared with the case where jigs of the prior art made of crystallized glass material are used, since its coefficient of thermal expansion is controlled to be $3.8\times10^{-6}/°C.$ or more, whereby the change can be inhibited of the vitreous plate shape into a trapezoid due to the friction caused during the heat treatment by the difference in thermal expansion between the vitreous plate and the jig. Further, the jig itself becomes more likely to be heated uniformly, since its thermal conductivity is controlled to be 10 W/mK or more, whereby the heating/cooling durations for subjecting the vitreous plate to uniform heat treatment can be reduced, resulting in improvement in production efficiency.

In the first and second jigs for use in heat treatment, their apparent porosities are controlled to be in the range of 0.2 to 25%, preferably in the range of 3 to 25%, whereby any one of the jigs according to this invention offers the advantages, in addition to the aforementioned advantages, of being able to promptly discharge the air introduced thereinto when loaded with a vitreous plate through the pores, and therefore, quickly position the vitreous plate and of being able to be supplied with air through the pores when unloaded, and therefore, making it easier to unload the vitreous plate therefrom. Further, their apparent porosities are preferably controlled to be in the range of 3 to 25%, whereby the cutting resistance toward the normal line on the whetstone during cutting operation is decreased, and therefore, the machining duration can be reduced, resulting in improvement in productivity.

The first jig for use in heat treatment contains 50% by weight or more phase of SiC, and the jig having a coefficient of thermal expansion and a thermal conductivity both suitable for heat treatment of vitreous plates can be obtained by allowing the same to contain SiC as a main constituent. The phase of SiC has a continuous porous network structure which may be made up of SiC particles self-bonded to each other by the re-crystallizing reaction of themselves or may be made up by the reaction of C and Si.

As a constituent other than SiC, preferably the jigs contain metal Si as an additional phase. Containing metal Si as an additional phase allows the pores to be filled up with the metal, leading to improvement in their thermal conductivity. And controlling the amount of the metal Si with which the pores are filled up enables controlling the apparent porosity to be at a prescribed value.

The second jig for use in heat treatment contains 50% by weight or more SiC particles of diameter 3.5 mm or less, and the jig having a coefficient of thermal expansion and a thermal conductivity both suitable for heat treatment of vitreous plates can be obtained by allowing the same to contain SiC as a main constituent, like the aforementioned first jig for use in heat treatment. And the use of SiC particles of diameter 3.5 mm or less enables maintaining the strength of the sintered compact and producing thin jigs for use in heat treatment of which average thickness is 4 to 7 mm.

The above SiC particles may be in state where they are bonded to each other through the additional phase of oxides, nitrides and oxi-nitrides, or of metal Si. For example, jigs for use in heat treatment which contain $SiO_2$ material, or $Si_3N_4$ and $Si_2ON_2$ materials as the additional phase allow the SiC particles to bond to each other at a low temperature at the time of their production, compared with jigs in which SiC particles are self-bonded to each other through the re-crystallizing reaction of themselves or are constructed through the reaction of C and metal Si, and the former have advantages over the latter in production costs and yield.

Further, allowing the aforementioned first jig for use in heat treatment to contain $SiO_2$ material, or $Si_3N_4$ and $Si_2ON_2$ materials as the additional phase and controlling the amount of the existing $SiO_2$ material phase or of the existing $Si_3N_4$ and $Si_2ON_2$ material phases enables filling of the pores with the additional phases to a designed value, which in turn enables controlling of their apparent porosity.

Jigs for use in heat treatment in which SiC particles are self-bonded to each other through the re-crystallizing reaction can be produced, for example, by first forming SiC powder into a prescribed jig shape and then firing the obtained formed compact at high temperatures in the range of 2000 to 2400° C. in the atmosphere of an inert gas, such as Ar. Firing at such high temperatures allows the SiC component to evaporate through the SiC particle surface, and the evaporated SiC component is re-crystallized at the contact portions (neck portions) among the particles, and thereby the neck portions grow and the particles are brought to the bonded state.

Jigs for use in heat treatment which contain $SiO_2$ material as the additional phase can be produced, for example, by first forming a forming raw material, which is obtained by adding a $SiO_2$ source such as clay and, if necessary, additives to SiC powder and mixing them, into a prescribed jig shape and then firing the obtained formed compact at temperatures in the range of 1300 to 1500° C. in the atmosphere.

Jigs for use in heat treatment which contain $Si_3N_4$ and $Si_2ON_2$ materials as the additional phases can be produced, for example, by first forming a forming raw material, which is obtained by adding Si and, if necessary, various auxiliaries to SiC powder and mixing them, into a prescribed jig shape and then firing the obtained formed compact at temperatures in the range of 1300 to 1500° C. in the $N_2$ atmosphere. Specifically, most Si in the formed compact is nitrided to produce $Si_3N_4$ while part of Si in the same is oxidized by $O_2$ contained in the formed compact to produce $Si_2ON_2$, and SiC particles, which are to become an aggregate, are bonded to each other through $Si_3N_4$ and $Si_2ON_2$.

Jigs for use in heat treatment which contain metal Si as the additional phase can be produced, for example, by first forming SiC powder into a prescribed jig shape and then firing the obtained formed compact at temperatures in the range of 1450 to 1800° C. in a reduced inert gas atmosphere in which metal Si exists or in a vacuum while allowing the formed compact to be infiltrated with the metal Si. The metal Si having been melted and infiltrated into the formed compact during the firing is filled into the pores, so as to not only bond SiC particles, which are to become an aggregate, to each other, but also make the formed compact denser. Controlling the amount of the metal Si filled into the pores enables controlling of the apparent porosity.

Alternatively, jigs for use in heat treatment which contain metal Si as the additional phase can be produced, for example, by firing the SiC particles, which have already been self-bonded to each other through the re-crystallizing reaction, in a reduced inert gas atmosphere in which metal Si exists or in a vacuum and filling the metal Si into the pores of the re-crystallized SiC.

EXAMPLES

In the following the present invention will be described in detail taking examples of the preferred embodiments; however, it is to be understood that these examples are shown for illustrative purposes only and are not intended to limit this invention.

Example 1

A formed compact, which was obtained by adding polycarboxylic acid dispersant, acrylic emulsion and ion-exchanged water to a powder mixture of 50% by weight SiC particles of average diameter 100 μm and 50% by weight SiC particles of average diameter 1 μm and then forming the mixture in a prescribed jig shape, was dried in a drier at 40° C. over night and fired at 2200° C. in an Ar atmosphere for 1 hour, to obtain a jig for use in heat treatment of the example 1.

Examples 2 to 4

The jig for use in heat treatment of the above example 1 was heated at 1500° C. in a vacuum atmosphere at an absolute pressure of 50 mBar in which metal Si exists for 1 hour, so as to allow the pores of the jig to be infiltrated with the metal Si, and were obtained the jigs for use in heat treatment of the examples 2 to 4 of which apparent porosities had been controlled as shown in Table 1.

Example 5

A formed compact, which was obtained by adding methyloxy cellulose and ion-exchanged water to a powder mixture of: 45% by weight SiC particles of the maximum diameter 3.5 mm obtained by grinding a mass of SiC of particle diameter 5 to 20 mm and sieving the ground particles; 45% by weight SiC particles of average diameter 10 μm; and 10% by weight gairome-clay and then forming the mixture in a prescribed jig shape, was dried in a drier at 40° C. over night and fired at 1400° C. in the atmosphere for 1 hour, to obtain a jig for use in heat treatment of the example 5.

Example 6

A formed compact, which was obtained by adding methyloxy cellulose and ion-exchanged water to a powder mixture of: 40% by weight SiC particles of the maximum diameter 3.5 mm obtained by grinding a mass of SiC of particle diameter 5 to 20 mm and sieving the ground particles; 40% by weight SiC particles of average diameter 10 μm; 10% by weight gairome-clay; and 10% by weight metal Si and then forming the mixture in a prescribed jig shape, was dried in a drier at 40° C. over night and fired at 1400° C. in a $N_2$ atmosphere for 1 hour, to obtain a jig for use in heat treatment of the example 6.

Example 7

A formed compact, which was obtained by adding polycarboxylic acid dispersant, acrylic emulsion and ion-exchanged water to a powder mixture of: 50% by weight SiC particles of average diameter 100 μm; 49% by weight SiC particles of average diameter 1 μm; and 1% by weight carbon powder and then forming the mixture in a prescribed jig shape, was dried in a drier at 40° C. over night and fired at 1800° C. in an Ar atmosphere for 1 hour while being loaded with Si powder sufficient to fill the pores thereof, to obtain a jig for use in heat treatment of the example 7.

Example 8

A formed compact, which was obtained by adding methyloxy cellulose and ion-exchanged water to a powder mixture of: 25% by weight SiC particles of the maximum diameter 3.5 mm obtained by grinding a mass of SiC of particle diameter 5 to 20 mm and sieving the ground particles; 25% by weight SiC particles of average particle diameter 10 μm; 20% by weight gairome-clay; and 30% by weight alumina powder of average particle diameter 10 μm and then forming the mixture in a prescribed jig shape, was dried in a drier at 40° C. over night and fired at 1400° C. in the atmosphere for 1 hour, to obtain a jig for use in heat treatment of the example 8.

Example 9

A formed compact, which was obtained by adding methyloxy cellulose and ion-exchanged water to a powder mixture of: 25% by weight SiC particles of the maximum diameter 3.5 mm obtained by grinding a mass of SiC of particle diameter 5 to 20 mm and sieving the ground particles; 25% by weight SiC particles of average particle diameter 10 μm; and 50% by weight metal Si and then forming the mixture in a prescribed jig shape, was dried in a drier at 40° C. over night and fired at 1400° C. in a $N_2$ atmosphere for 1 hour, to obtain a jig for use in heat treatment of the example 9.

Example 10

A formed compact, which was obtained by adding methyloxy cellulose and ion-exchanged water to a powder mixture of: 40% by weight SiC particles of average particle diameter 70 μm; 40% by weight SiC particles of average particle diameter 1 μm; 5% by weight gairome-clay; and 15% by weight metal Si and then forming the mixture in a prescribed jig shape, was dried in a drier at 40° C. over night, fired at 1400° C. in a $N_2$ atmosphere for 1 hour and heat treated at 1300° C. in the atmosphere for 1 hour, to obtain a jig for use in heat treatment of the example 10.

(Characteristics of Jigs for Use in Heat Treatment)

The measurements of the characteristics of the jigs for use in heat treatment of the above examples 1 to 10 are shown in Table 1. For comparison, the measurements of the characteristics of the currently used jigs for use in heat treatment, which use an alumina material (comparative example 1) and a crystallized glass material (comparative example 2), are also shown in the same table.

TABLE 1

|  | Material | Strength at Room Temperature (MPa) | Apparent Porosity (%) | Coefficient of Thermal Expansion ($\times 10^{-6}$/° C.) | Thermal Conductivity (W/mK) | Grinding Resistance in the Normal Line Direction (N) |
| --- | --- | --- | --- | --- | --- | --- |
| Example 1 | SiC | 90 | 25 | 3.9 | 20 | 10 |
| Example 2 | SiC | 250 | 0.2 | 3.8 | 160 | 40 |
| Example 3 | SiC | 150 | 3 | 3.9 | 120 | 25 |
| Example 4 | SiC | 100 | 15 | 3.9 | 100 | 17 |
| Example 5 | SiC | 70 | 8 | 4.2 | 15 | 12 |
| Example 6 | SiC | 75 | 7 | 4.1 | 13 | 15 |
| Example 7 | SiC | 200 | 0.5 | 3.8 | 150 | 40 |
| Example 8 | SiC | 50 | 10 | 5.5 | 10 | 11 |

TABLE 1-continued

|  | Material | Strength at Room Temperature (MPa) | Apparent Porosity (%) | Coefficient of Thermal Expansion ($\times 10^{-6}/°$ C.) | Thermal Conductivity (W/mK) | Grinding Resistance in the Normal Line Direction (N) |
|---|---|---|---|---|---|---|
| Example 9 | SiC | 60 | 9 | 4.2 | 16 | 10 |
| Example 10 | SiC | 120 | 0.7 | 4.0 | 15 | 20 |
| Comparative Example 1 | Alumina | 280 | 2 | 7.9 | 21 | — |
| Comparative Example 2 | Crystallized Glass | 140 | 0 | −0.4 | 1 | — |

As described so far, the jigs according to this invention have an appropriate coefficient of thermal expansion which enables inhibiting of warps caused with time in the jigs themselves and of deformations in vitreous plates due to the friction caused during their heat treatment. The jigs according to this invention also have an excellent thermal conductivity, whereby heat treatment of vitreous plates can be carried out uniformly and effectively in a relatively short period time. Furthermore, in the jigs according to this invention, positioning and unloading of vitreous plates on and from the jigs can be carried out easily, without providing the jigs with new pores, only by controlling their apparent porosities to a prescribed value.

What is claimed is:

1. A SiC jig for treatment of a vitreous plate having films exhibiting respective given functions a surface of the vitreous plate, wherein the SiC jig comprises 50% or more by weight of a phase consisting essentially of SiC, the jig having (1) a thermal conductivity of W/mK or more, (2) an apparent porosity of 0.2 to 25%, and (3) a coefficient of thermal expansion of $3.8 \times 10^{-6}/°$ C. to $5.5 \times 10^{-6}/°$ C.

2. The SiC jig according to claim 1, further comprising metal Si as an additional phase.

3. The SiC jig according to claim 1, wherein the apparent porosity is 3 to 25%.

4. The SiC jig according to claim 1, further comprising $SiO_2$ as an additional phase.

5. The SiC jig according to claim 1, further comprising $Si_3N_4$ and $Si_2ON_2$ as additional phases.

6. The SiC jig according to claim 1, further comprising metal Si as an additional phase.

7. The SiC jig according to claim 1, wherein the apparent porosity is 3 to 25%.

8. The SiC jig according to claim 1, made from a mixture comprising 50% or more, by weight of the total mixture, of SiC particles of particle diameter not more than 3.5 mm.

9. A SiC ceramic comprising 50% or more by weight of a phase consisting essentially of SiC, the SiC ceramic having (1) a thermal conductivity of 10 W/mK or more, (2) an apparent porosity of 0.2 to 25%, and (3) a coefficient of thermal expansion of $3.8 \times 10^{-6}/°$ C. to $5.5 \times 10^{-6}/°$ C.

* * * * *